INTEGRATED CIRCUIT PROCESS AND STRUCTURE

Filed April 20, 1961

INVENTOR
JOHN C. MARINACE

BY John F. Ohlandt Jr.
ATTORNEY

United States Patent Office 3,267,338

Patented August 16, 1966

3,267,338

INTEGRATED CIRCUIT PROCESS AND STRUCTURE

John C. Marinace, Yorktown Heights, N.Y., assignor to International Business Machines Corporation, New York, N.Y., a corporation of New York Filed Apr. 20, 1961, Ser. No. 104,421
14 Claims. (Cl. 317—234)

This invention reltates to semiconductor device formation and in particular to novel semiconductor structures and to the techniques by which they are fabricated.

In the recent past, great interest has centered on the development of semiconductor devices which employ several different semiconductor materials in an integral single crystal body. Such devices have been called hetero-junction devices because, in general, they include within the integral structure of the body an electrical junction between the respective materials. Great difficulties attend the attempt to join in intimate contact different semiconductor materials. One process which has been successful is that of epitaxial growth from the vapor phase. Specifically, this process involves a halide disporportionation reaction wherein a first semiconductor material to be deposited is reacted with a halogen source and the reaction product so formed is thereafter decomposed and the freed first semiconductor material deposited onto a substrate of a second, different semiconductor material. When the crystalline orientation of the deposit is dependent upon the crystalline orientation of the substrate each material is said to be epitaxial with respect to the other. The process which will produce such a hetero-epitaxial structure is disclosed in Marinace et al. Patent 3,072,507, issued on January 8, 1963, and assigned to the assignee of the present invention.

What has been discovered is a novel structural principle, called composite junction formation, which advantageously exploits the above described structure-forming capability of the vapor growth process. In accordance with this structural principle, a hetero-epitaxial crystalline body is formed and connection is made in a unique way to the faces of the crystalline body so as to conjoin effectively in an integral crystal structure the special properties and characteristics of the individual regions which constitute the structure. This type of connection may be described as a composite connection. In accordance with several embodiments of the present invention the desired composite connection is effected by an overlaying technique, that is to say, the surfaces defined by the individual regions of the originally formed structure are overlaid in equal or unequal proportions and there is achieved in one simple operation the particular kinds of connections required for the several regions.

The principle discussed above finds application in accordance with one feature of the present invention by the formation of a structure having an inert substrate region of one semiconductor material serving as the insulative support for a thin region of another semiconductor material, the thin region performing as the active element in the composite structure.

In another aspect the present invention contemplates the formation of solid state circuit packages where, for example, an integrally formed circuit is simply attained by the overlaying technique previously alluded to. In accordance with this latter aspect, two or more semiconductor regions contiguous at one surface are initially formed. Following this, by judicious selection of materials, a composite connection is made to the plural region body so that what eventuates is a circuit made up entirely of solid material in contact. Such a solid state circuit package requires only the attachment of power supply leads and entirely eliminates the conductors normally required for connecting separated circuit components. Moreover, high-frequency performance is enhanced by the close spacing of components.

It is therefore an object of the present invention to provide the facility for forming composite junction structures and devices.

Another object is to obtain composite devices which advantageously unite the properties and attributes of different semiconductor materials in integral structures having combinations of active or passive components.

Another object is to obtain a device whose active portion is very thin but which is mechanically rugged.

Let another object is to achieve solid state circuit packages where the circuit is realized completely from an integral crystalline structure.

A more specific object is to provide a solid state Esaki diode oscillator circuit.

The foregoing and other objects, features and advantages of the invention will be apparent from the following more particular description of preferred embodiments of the invention, as illustrated in the accompanying drawings.

Figure 1:
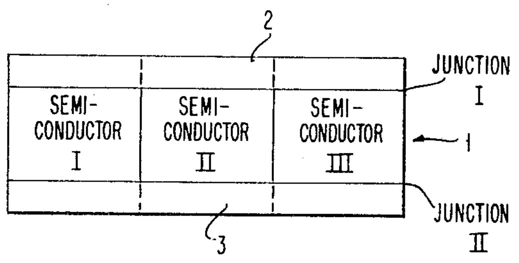
FIG. 1 is a general illustration of the principle of the present invention.

Referring now to FIG. 1, there is illustrated a general composite semiconductor junction structure where, as an example, three different semiconductor materials form the three separate regions I, II and III of the body 1, the regions being contiguous at one surface. Over the entire top portion of the body, junction I is formed and over the entire bottom portion junction II is formed. These junctions can be realized by alloying to the three semiconductor regions, by diffusing an impurity into all three regions or by growing another semiconductor region on the three originally formed regions. The dotted lines in the figure serve to indicate that in the case of alloying or diffusing the final structure is coextensive with the original body. In the case where a semiconductor material is grown onto the original body, thereby forming junctions I and II, layers 2 and 3 constitute additions to the original body. It will be appreciated, in connection with the illustration provided in FIG. 1, that the term "junction" is used in its generic sense as a point or place of union. The nature of the junctions, whether rectifying or not, will, of course, depend upon the materials employed in producing the union. Furthermore, the nature of the junctions formed within the structure will determine the current-voltage characteristic from one terminal to another. It will be understood that minor junctions such as those formed between the regions I, II and III may be electrically operative also and that within the confines of regions I, II and III there may be formed additional hetero-junctions or homo-junctions.

Figure 2:
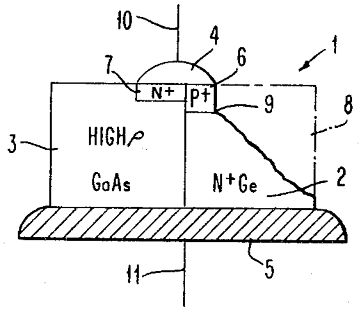
FIG. 2 illustrates a specific embodiment where the structure includes a thin active element supported by a high resistivity substrate.

Referring now to FIG. 2, a specific composite junction device is illustrated as one embodiment of the present invention. Here the aim is to produce a structure that includes a thin active device with a firm, heavy support for the device. In the case where it is contemplated that the active device be an Esaki diode, it is important that a very small area junction be formed in fabricating such a device. To achieve these ends, certain specific materials and specialized procedures may be employed. However, it will be recognized that the invention is not limited to the use of particular materials and procedures.

In obtaining the structure of FIG. 2, generally denoted by reference numeral 1, germanium which is degenerately doped, for example with arsenic or phosphorus, is grown from the vapor onto a substrate 3 of gallium arsenide in accordance with a process previously described in the aforesaid Marinace et al. Patent 3,072,507. The substrate of gallium arsenide is selected to have a room temperature resistivity of approximately 5 MΩ-cm. It is to be noted that with the ability to select different materials certain clear advantages accrue to the fabrication of a composite device. For example, one is able to obtain the desirable germanium diode characteristics which allow operation at very low power levels while an extremely high resistivity support for the germanium diode device is realized because of the nature of the crystallographically compatible gallium arsenide material, wherein high levels of resistivity are practicable. Had germanium been used for the support material, the maximum resistivity would be only 50 Ω-cm. Of course, it will be appreciated that other desirable unions of specialized properties of different materials may also be exploited in line with the broad teaching of the present invention.

Returning now to FIG. 2, the grown portion of germanium 2 and the substrate 3 are overlaid on one surface, which has been lapped flat, with a solder dot 4 whose composition is, for example, tin and gallium. A broad area ohmic contact 5 is made to the opposite surface of the structure in a conventional manner. By judicious selection of the impurities, such as tin and gallium, and by heating the solder dot sufficiently to dissolve a layer of the top surface, upon cooling down the entire assembly there will be formed internally of the crystal structure, due to the high level of impurity employed, a heavily doped P-conductivity region 6, as illustrated, in union with the heavily doped N-conductivity grown region 2 of germanium. During the alloying process, the temperature is maintained sufficiently high for the tin-gallium to dissolve an appreciable amount of germanium, but not high enough to dissolve any appreciable amount of gallium arsenide. The P-conductivity of region 6 obtains because of the presence of gallium in this re-crystallized germanium region as a result of the alloying operation. The tin used in the solder, is, of course, neutral in germanium. The region 7 union with the substrate 3 will be N-conductivity type because of the presence of the tin. It may thus be seen that a high resistivity and therefore insulative portion is provided in shunt with a thin germanium Esaki diode. The germanium portion of the structure is etched to remove the section 8, as illustrated in dashed outline, to produce the final structure depicted in FIG. 2 where, as a result of the etching step, a very small cross-sectional area is obtained at the junction 9. Also, as a result of the etching the capacitance is reduced to a low value. Electrical conductors 10 and 11 are now attached for circuit connecting purposes.

Figure 3:
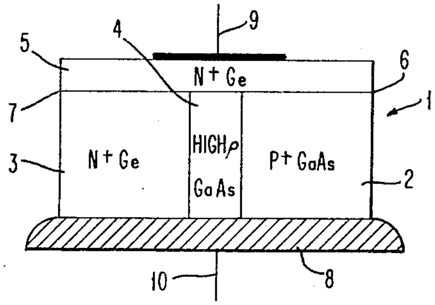
FIG. 3 illustrates another imbodiment which provides an Esaki diode and a shunt resistor in an integral strucure.

Turning now to FIG. 3, a procedure in some ways similar to that followed in connection with FIG. 2 is employed. The aim here, however, is to produce an Esaki diode oscillator in an integral structure. An Esaki diode oscillator of this general type has been shown in application Serial Number 831,751, now abandoned.

The body 1 in FIG. 3 is constituted of degenerately doped P-type gallium arsenide in the region 2 on the right and heavily doped N-type germanium in the region 3 on the left. Intermediate these regions, a region 4 of high resistivity gallium arsenide is formed. Over the three regions a layer 5 of degenerately doped N-type germanium is deposited by the vapor growth process previously described. A rectifying junction 6 exists at the interface between degenerately doped regions 2 and 5 while an ohmic junction 7 exists at the interface between regions 3 and 5. The structure of FIG. 3 provides a heterojunction Esaki diode on the right comprising the germanium region 5 and the gallium arsenide region 2 and in shunt with the diode a resistor comprising regions 3 and 5. The intermediate region 4 serves to isolate electrically the regions 2 and 3. A broad area ohmic contact 8 is made to the opposite surface defined by regions 2, 3 and 4. The right hand portion of the final structure may be etched as was done with the structure of FIG. 2 so as to provide a very small area junction between regions 2 and 5. Again, electrical conductors 9 and 10 are attached to the regions 5 and 8 respectively for circuit connecting purposes.

Although the regions 2, 3 and 4 were overlaid with vapor grown region 5, it will be understood that an alloying technique such as was employed in the formation of the structure of FIG. 2 can also be used in forming the composite structure of FIG. 3. Thus, a solder dot containing suitable impurities may be situated to overlay the regions 2, 3 and 4 and contact made as previously explained.

Figure 3A:
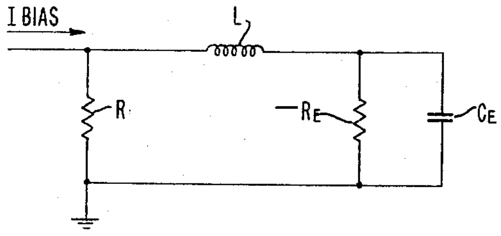
FIG. 3A illustrates the equivalent circuit for the structure of FIG. 3.

The current voltage characteristic of the heterojunction Esaki diode formed on the right of the structure of FIG. 3 will exhibit the well-known negative resistance portion in the forward bias direction. Such a characteristic has been discussed in an article by Leo Esaki appearing in the Physical Review, January 1958, at page 603. The equivalent circuit for the structure of FIG. 3 is illustrated in FIG. 3A where the Esaki diode part of the structure is represented by a negative resistance $-R_E$ in parallel with a capacitor $C_E$. The bias resistor R represents the germanium resistor portion of the structure, as previously described and the inductance L is the loop inductance, made up chiefly of the inductance of the deposited region 5. In the circuit of FIG. 3A the requisite condition for oscillation is that $R<|-R_E|$.

Figure 4:
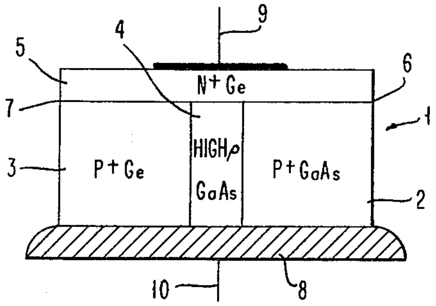
FIG. 4 illustrates a further embodiment similar to FIG. 3 but having two Esaki diodes in parallel.

In FIG. 4, a structure quite similar to that of FIG. 3 is depicted. Here, however, two Esaki diodes in parallel are provided in the integral structure. Such an arrangement has the advantage that one diode of desirable current-voltage characteristic may be caused to act as a load upon another diode, considered as the active element. With such an arrangement a desirable "load line" will be achieved for operation of the active element as an Esaki diode oscillator in a class C mode at low power levels. Such a mode of operation has been described in Rutz Patent 3,054,070, issued on February 8, 1962, and assigned to the assignee of the present invention.

The formation of the structure of FIG. 4 is obtained by the procedure described in connection with FIG. 3. However, region 3 of the body is now constituted of degenerately doped P-conductivity germanium so that when the degenerately doped N-conductivity germanium of region 5 is deposited a rectifying junction 7 is obtained. Thus, an Esaki dode is realized on the left in shunt with the Esaki diode on the right.

While the invention has been particularly shown and described with reference to preferred embodiments thereof, it will be understood by those skilled in the art that various changes in form and details may be made therein without departing from the spirit and scope of the invention.

What is claimed is:

1. A composite semiconductor crystalline structure comprising a semiconductor body having a surface defined by at least two contiguous regions, a first region constituted of a first semiconductor material, a second region constituted of a second, different, semiconductor material; and a quantity of semiconductor material overlaying portions of said at least two regions at said surface so as to form a rectifying connection to at least one of said regions.

2. A composite semiconductor crystalline structure comprising a semiconductor body having a surface defined by at least two contiguous regions, a first region constituted of a first semiconductor material, a second region constituted of a second, different semiconductor material; a quantity of semiconductor material contiguously overlaying portions of said at least two regions at said surface defined by said regions so as to form a rectifying connection to at least one of said regions and an ohmic connection to another of said regions; and an ohmic contact jointly overlaying said at least two regions on an opposite surface of said body.

3. A composite semiconductor junction device comprising a semiconductor body having a surface defined by at least two regions, a first region constituted of a first semiconductor material, a second region constituted of a second, different, semiconductor material; a first one of said regions being of P-conductivity type and another of said regions being of N-conductivity type; a section of semiconductor material of N-conductivity type overlaying portions of said at least two regions at said surface so as to form a rectifying junction with the first one of said at least two regions; an ohmic contact jointly overlaying said at least two regions on an opposite surface of said body; and circuit connecting means electrically connected with said section of semiconductor material and with said ohmic contact.

4. A composite semiconductor junction device comprising a semiconductor body having a surface defined by at least two regions, a first region constituted of a first semiconductor material, a second region constituted of a second, different, semiconductor material; a first one of said regions being of P-conductivity type and another of said regions also being of P-conductivity type; a section of semiconductor material of N-conductivity type overlaying portions of said at least two regions at said surface so as to form a rectifying junction with the first one of said at least two regions; an ohmic contact jointly overlaying said at least two regions on an opposite surface of said body; and circuit connecting means electrically connected with said section of semiondutor material and with said ohmic contact.

5. A composite semiconductor crystalline structure comprising a semiconductor body having a surface defined by two contiguous regions, a first region constituted of germanium and a second region constituted of gallium arsenide; and a quantity of semiconductor material contiguously overlaying portions of said two regions at said surface so as to form a rectifying connection to said germanium region and an ohmic connection to said gallium arsenide region.

6. A composite semiconductor crystalline structure comprising a semiconductor body having a surface defined by two contiguous regions, a first region constituted of germanium of a predetermined conductivity type and a second region of high resistivity gallium arsenide; and a quantity of semiconductor material overlaying portions of said two regions at said surface so as to form a rectifying connection with said germanium region of predetermined conductivity type and an ohmic connection to said high resistivity gallium arsenide region.

7. A composite semiconductor junction device comprising a semiconductor body having a surface defined by two contiguous regions, a first region constituted of germanium of a predetermined conductivity type and a second region of high resistivity gallium arsenide; a quantity of semiconductor material overlaying portions of said two regions at said surface, the portion overlaying asid first region being constituted of germanium of opposite conductivity type to thereby form a rectifying junction with said region of predetrmined conductivity type, the portion overlaying said second region forming an ohmic connection to said high resistivity gallium arsenide; an ohmic contact jointly overlaying said two regions on an opposite surface of said body; and circuit connecting means connected with said quantity of semiconductor material and with said ohmic contact, whereby a device having an active diode portion and an insulating support therefor is obtained.

8. A process for forming a composite semiconductor crystalline structure comprising fabricating a semiconductor body having a surface defined by at least two contiguous regions, a first region constituted of a first semiconductor material, a second region constituted of a second, different, semiconductor material; and overlaying portions of said at least two regions at said surface with a quantity of semiconductor material so as to form a rectifying connection to at least one of said regions.

9. A process for forming a composite semiconductor crystalline structure comprising fabricating a semiconductor body having a surface defined by at least two contiguous regions, a first region constituted of a first semiconductor material, a second region constituted of a second, different, semiconductor material; overlaying surface portions of said at least two regions with a quantity of material which is inert with respect to conductivity type determination in one of said regions and which is conductivity type determining in another of said regions; and alloying said quantity of material with the surface portions of said body defined by said at least two contiguous regions to form thereby internally of said body a recrystallized region defining a rectifying junction with said another region of said body and an ohmic connection with said one region of said body.

10. A process as defined in claim 9 wherein said another region of said body is constituted of germanium and said one region of said body is constituted of gallium arsenide and wherein said quantity of material comprises tin and gallium.

11. A process for forming a composite semiconductor junction device comprising fabricating an integral single crystal body by depositing a thin layer of one semiconductor material epitaxially onto a substrate of another different semiconductor material, said thin layer being of predetermined conductivity type and said substrate being high resistivity; overlaying portions of the surface defined by said thin layer and said substrate with a quantity of material comprising a substance which is opposite conductivity type determining with respect to the material of said thin layer; and alloying said quantity of material with said portions of the surface to form thereby internally of said body a re-crystallized region defining a rectifying junction with said thin layer and an ohmic connection with said substrate.

12. A process as defined in claim 11 wherein said thin layer is constituted of germanium, said high resistivity substrate is constituted of gallium arsenide, and said quantity of material comprises tin and gallium.

13. A process of forming a composite semiconductor junction device comprising fabricating an integral single crystal body by depositing a thin layer of one semiconductor material epitaxially onto a substrate of another different semiconductor material, said thin layer being of predetermined conductivity type; and growing onto the surface defined by said thin layer and said substrate a region of semiconductor material of opposite conductivity type.

14. A process for forming a composite semiconductor junction device comprising fabricating a single crystal body by depositing a thin layer of one semiconductor material epitaxially onto a substrate of another different semiconductor material, said thin layer being of a first conductivity type and said substrate being of opposite conductivity type; and growing a region of semiconductor material of opposite conductivity type onto a surface defined by said thin layer and said substrate.

References Cited by the Examiner

UNITED STATES PATENTS

| | | | |
|---|---|---|---|
| 2,770,761 | 11/1956 | Pfann | 317—235 |
| 2,802,760 | 8/1957 | Derick et al. | 148—1.5 |
| 2,985,804 | 5/1961 | Buie | 317—235 |
| 3,004,196 | 10/1961 | Drexel | 317—234 |

(Other references on following page)

UNITED STATES PATENTS

| | | | |
|---|---|---|---|
| 3,008,089 | 7/1961 | Uhlir | 317—234 |
| 3,041,508 | 6/1962 | Henkel et al. | 317—234 |
| 3,054,070 | 9/1962 | Rutz | 307—88.5 X |
| 3,057,762 | 10/1962 | Gans | 317—235 X |
| 3,070,762 | 12/1962 | Evans | 317—235 X |
| 3,072,507 | 1/1963 | Anderson et al. | 148—33 |
| 3,102,828 | 9/1963 | Courvoisier | 117—227 |
| 3,104,991 | 9/1963 | MacDonald | 148—1.5 |
| 3,111,611 | 11/1963 | Hunter | 317—235 |
| 3,119,072 | 1/1964 | Sommers | 317—235 X |
| 3,176,147 | 3/1965 | Miller | 317—235 X |

FOREIGN PATENTS

| | | |
|---|---|---|
| 1,193,194 | 10/1959 | France. |

JOHN W. HUCKERT, *Primary Examiner.*

GEORGE N. WESTBY, JAMES D. KALLAM, *Examiners.*

A. S. KATZ, R. S. SANDLER, *Assistant Examiners.*